(12) United States Patent
Li et al.

(10) Patent No.: US 10,957,721 B1
(45) Date of Patent: Mar. 23, 2021

(54) MANUFACTURING METHOD FOR CMOS LTPS TFT SUBSTRATE

(71) Applicant: Wuhan China Star Optoelectronics Technology Co., Ltd., Wuhan (CN)

(72) Inventors: Lisheng Li, Wuhan (CN); Guanghui Liu, Wuhan (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 348 days.

(21) Appl. No.: 16/309,446

(22) PCT Filed: Sep. 18, 2018

(86) PCT No.: PCT/CN2018/106332
§ 371 (c)(1),
(2) Date: Dec. 12, 2018

(87) PCT Pub. No.: WO2019/200835
PCT Pub. Date: Oct. 24, 2019

(30) Foreign Application Priority Data

Apr. 20, 2018 (CN) .......................... 201810362824.1

(51) Int. Cl.
*H01L 27/12* (2006.01)
*H01L 29/10* (2006.01)

(52) U.S. Cl.
CPC ........ *H01L 27/1259* (2013.01); *H01L 27/127* (2013.01); *H01L 27/1288* (2013.01); *H01L 29/1079* (2013.01)

(58) Field of Classification Search
None
See application file for complete search history.

(56) References Cited

U.S. PATENT DOCUMENTS

| 6,846,707 B2 | 1/2005 | Chang |
| 7,064,021 B2 | 6/2006 | Chang |
| (Continued) | | |

FOREIGN PATENT DOCUMENTS

| CN | 104167390 A | 11/2014 |
| CN | 108511464 A | 9/2018 |

*Primary Examiner* — Steven B Gauthier
(74) *Attorney, Agent, or Firm* — Leong C. Lei

(57) ABSTRACT

The CMOS LTPS TFT substrate manufacturing method, by a semi-transparent mask, forms a second photoresist pattern having a second photoresist section above a second poly-Si active layer where P-type ion heavy doping is to be performed as protection. Then, N-type ions are effectively prevented from being implanted into the second poly-Si active layer's second source/drain contact region when conducting N-type ion heaving doping to the first poly-Si active layer. There is no need to compensate P-type ions during the subsequent P-type ion heavy doping to the second poly-Si active layer for forming the second source/drain contact region. The present invention therefore reduces the productivity loss in the P-type ion heaving doping process and, as N-type ion heaving doping does not affect the PMOS transistors, enhances the electrical convergence of the PMOS transistors. Damage to the film lattice structure by the ion implantation is also reduced, thereby increasing the device reliability.

10 Claims, 8 Drawing Sheets

(56) References Cited

U.S. PATENT DOCUMENTS

| | | | |
|---|---|---|---|
| 2007/0037069 A1* | 2/2007 | Ohnuma | H01L 27/1214 430/5 |
| 2007/0045627 A1* | 3/2007 | Park | H01L 27/127 257/66 |
| 2018/0122957 A1* | 5/2018 | Lu | H01L 29/78675 |

* cited by examiner

MANUFACTURING METHOD FOR CMOS LTPS TFT SUBSTRATE

FIELD OF THE INVENTION

The present invention is generally related to the field of display technology, and more particularly to a manufacturing method for complementary metal oxide semiconductor (CMOS) low temperature poly-silicon (LTPS) thin film transistor (TFT) substrate.

BACKGROUND OF THE INVENTION

In the field of display technologies, liquid crystal display (LCD) and active matrix organic light emitting diode (AMOLED) are widely applied to mobile phones, personal digital assistants (PDAs), digital cameras, computer screens, and notebook screens, due to their thin thickness, high quality, power saving, and low radiation.

Thin film transistor (TFT) array substrate is a key component to LCD and AMOLED devices, directly affecting the performance of these flat panel display devices. For the provision of driving circuit to the display devices, the TFT array substrate is usually configured with multiple gate scan lines and multiple data lines, jointly defining multiple pixel units. Each pixel unit is configured with TFT and pixel electrode. The gate of the TFT is connected to a corresponding gate scan line. When the voltage on the gate scan line reaches the threshold voltage, the source and drain of the TFT are conducted, and the voltage on the data line reaches the pixel electrode, thereby controlling the display of the corresponding pixel unit. Usually the TFT on the array substrate includes gate electrode, gate insulation layer, active layer, source and drain electrodes, and insulating protection layer, stacked sequentially from bottom to top on the substrate.

Compared to traditional amorphous silicon (a-Si) TFT, low temperature poly-silicon (LTPS) TFT, due to better carrier mobility, is widely applied to small-to medium-sized, high-resolution, LCD and AMOLED display panels, despite its more complex manufacturing process. LTPS is considered as an important material to achieve low-cost and full-color flat panel displays.

Currently, a metal oxide semiconductor (MOS) device is usually formed using LTPS. A MOS device may be a negative channel MOS (NMOS) device, a positive channel MOS (PMOS), or a complementary MOS (CMOS). The difference between NMOS and PMOS transistors mainly lies in that their source/drain contact regions are respectively formed using N-type ion heavy doping (P+, $1\times10^{14}$-$1\times10^{15}$ ions/cm$^2$) and P-type ion heavy doping (B+, $1\times10^{14}$-$1\times10^{15}$ ions/cm$^2$), and NMOS and PMOS transistors jointly form CMOS transistor. Hot carrier effect is a major factor causing MOS devices to fail. As MOS devices are continuously reduced in size, they suffer even severer hot carrier effect. To effectively control the hot carrier effect for LTPS MOS devices so as to enhance their reliability and improve the leakage current under negative bias condition, existing LTPS NMOS adopts a lightly doped drain (LDD) method in the manufacturing process by providing a lightly doped region in the poly-silicon (poly-Si) ditch around the source and drain, and distributing some voltage to this lightly doped region. Currently mostly applied LDD techniques are mask LDD and re-etch LDD. The manufacturing of LTPS array substrate using mask LDD forms the source/drain contact region by conducting N-type ion heavy doping to poly-Si active layer through photoresist pattern, and then forms the LDD region by conducting N-type ion light doping to poly-Si active layer through gate electrode self-alignment technique. Compared to the above mask LDD technique, re-etch LDD technique forms the gate electrode through two etchings, instead of through photoresist pattern, after patterning the poly-Si active layer. The metallic pattern after the first etching defines the source/drain contact region to be heavily doped. Then the gate electrode is obtained after the second etching. The LDD region is formed by conducting N-type ion light doping to poly-Si active layer through gate electrode self-alignment technique. Compared to mask LDD technique, the main advantage for re-etch LDD technique is a lithographic process is omitted, thereby saving the production cost for a mask, reducing the time for manufacturing LTPS TFT substrate, and increasing productivity. In manufacturing CMOS LTPS TFT substrate, usually 11~14 masks are required. To reduce lithographic process, LTPS CMOS array technique often adopts re-etch LDD to replace mask LDD, which generally includes the following steps.

Step S10, as shown in FIG. 1, forms a buffer layer 200 on a substrate 100, a first poly-Si active layer 310 corresponding to NMOS and a second poly-Si active layer 320 corresponding to PMOS on the buffer layer 200, a gate insulation layer 400 on the buffer layer 200 covering the first and second poly-Si active layers 310 and 320, a metallic layer 500 deposited on the gate insulation layer 400, and a first photoresist pattern 910 above a middle section of the first poly-Si active layer 310 and a second photoresist pattern 920 above a middle section of the second poly-Si active layer 320 on the metallic layer 500 by coating photoresist on the metallic layer 500 and conducting exposure and development to the photoresist with a mask.

Step S20, as shown in FIG. 2, forms a first quasi-gate electrode 510' above the first poly-Si active layer 310 and a second quasi-gate electrode 520' above the second poly-Si active layer 320 by conducting a first etching to the metallic layer 500 using the first and second photoresist patterns 910 and 920 as shielding layer.

Step S30, as shown in FIG. 3, obtains a first source/drain contact region 3101 at lateral end sections of the first poly-Si active layer 310 by conducting N-type ion heavy doping (P+, $1\times10^{14}$-$1\times10^{15}$ ions/cm$^2$) to lateral end sections of the first poly-Si active layer 310 not covered by the first quasi-gate electrode 510' using the first quasi-gate electrode 510' as shielding layer.

Step S40, as shown in FIG. 4, obtains a first gate electrode 510 from the first quasi-gate electrode 510' and a second gate electrode 520 from the second quasi-gate electrode 520' by conducting a second etching to the metallic layer 500 ad lifting the first and second photoresist patterns 910 and 920, where the width of the first and second quasi-gate electrodes 510' and 520' is reduced as their lateral ends are etched.

Step S50, as shown in FIG. 5, obtains a first ditch region 3102 in the middle section of the first poly-Si active layer 310 below the first gate electrode 510, and a first lightly doped drain (LDD) region 3103 between the first ditch region 3102 and the first source/drain contact region 3101 by conducting N-type ion light doping (P+, $1\times10^{12}$-$1\times10^{13}$ ions/cm$^2$) to lateral end sections of the first poly-Si active layer 310 not covered by the first gate electrode 510 using the first gate electrode 510 as shielding layer.

Step S60, as shown in FIG. 6, forms a photoresist protection layer 950 on the gate insulation layer 400 and the first gate electrode 510 that covers the first poly-Si active layer 310, obtains a second source/drain contact region 3201 at lateral end sections of the second poly-Si active layer 320 and a second ditch region 3202 in the middle section of the second poly-Si active layer 320 below the second gate electrode 520 by conducting P-type ion heavy doping (B+, $1\times10^{14}$-$1\times10^{15}$ ions/cm$^2$) to lateral end sections of the second poly-Si active layer 320 not covered by the second gate electrode 520 using the second gate electrode 520 as shielding layer.

In the above CMOS re-etch LDD technique, as a mask for N-type ion heavy doping is omitted, the N-type ion heavy doping conducted to the first poly-Si active layer 310 corresponding to NMOS would also happen to the second poly-Si active layer 320 corresponding to PMOS. Subsequently, to compensate the phosphorus (P) ions implanted into the second poly-Si active layer 320 and to turn the second poly-Si active layer 320 from N-type to P-type semiconductor, a higher dosage of boron (B) ions has to be implanted during the P-type ion heavy doping, which results in the following influence.

1. The higher dosage of P-type ion heavy doping would compromise productivity of the P-type ion heavy doping process.

2. Uneven N-type ion heavy doping and incompatible depth of ion implantation during P-type ion heavy doping causes inferior electrical convergence to PMOS transistors.

3. The source/drain contact region of PMOS transistor undergoes ion doping three times, causing significant damage to the lattice structure of the gate insulation layer 400 and poly-Si film, and reducing device reliability, negative bias stability, and breakdown voltage.

SUMMARY OF THE INVENTION

An objective of the present invention is to teach a manufacturing method for CMOS LTPS TFT substrate that, by a semi-transparent mask, forms a second photoresist pattern having a second photoresist section above a second poly-Si active layer where P-type ion heavy doping is to be performed as protection. Then, N-type ions are effectively prevented from being implanted into the second poly-Si active layer's second source/drain contact region when conducting N-type ion heaving doping to the first poly-Si active layer.

To achieve the objective, the present invention teaches a CMOS LTPS TFT substrate manufacturing method, including the following steps.

Step S1 provides a substrate, and forms a buffer layer on the substrate, a first poly-silicon (poly-Si) active layer and a second poly-Si active layer separated apart on the buffer layer, a gate insulation layer covering the first and second poly-Si active layers, a metallic layer deposited on the gate insulation layer, and a first photoresist pattern above a middle section of the first poly-Si active layer and a second photoresist pattern entirely covering the second poly-Si active layer on the metallic layer by coating photoresist on the metallic layer and conducting exposure and development to the photoresist with a semi-transparent mask, where the second photoresist pattern includes a first photoresist section in the middle and a second photoresist section adjoining the lateral sides of the first photoresist section and having a thickness smaller than the first photoresist section.

Step S2 forms a first quasi-gate electrode above the middle section of the first poly-Si active layer and a second quasi-gate electrode entirely covering the second poly-Si active layer by conducting a first etching to the metallic layer using the first and second photoresist patterns as shielding layer.

Step S3 obtains a first source/drain contact region at lateral end sections of the first poly-Si active layer by conducting N-type ion heavy doping to lateral end sections of the first poly-Si active layer not covered by the first quasi-gate electrode using the first photoresist pattern as shielding layer.

Step S4 reduces thickness of the first photoresist pattern and the second photoresist pattern by conducting ashing process to the first and second photoresist patterns, so that the thickness of the first photoresist pattern and the first photoresist section of the second photoresist pattern is reduced, and the second photoresist section of the second photoresist pattern is removed to expose two lateral ends of the second poly-Si active layer.

Step S5 obtains a first gate electrode from the first quasi-gate electrode and a second gate electrode from the second quasi-gate electrode by conducting a second etching to the metallic layer and lifting the remaining first and second photoresist patterns, where width of the second quasi-gate electrode is reduced as its lateral ends are etched, and the second gate electrode is above the middle section of the second poly-Si active layer.

Step S6 obtains a first ditch region in the middle section of the first poly-Si active layer below the first gate electrode, and a first lightly doped drain (LDD) region between the first ditch region and the first source/drain contact region by conducting N-type ion light doping to the first poly-Si active layer using the first gate electrode as shielding layer.

Step S7 forms a photoresist protection layer on the gate insulation layer and the first gate electrode that entirely covers the first poly-Si active layer, obtains a second source/drain contact region at lateral end sections of the second poly-Si active layer and a second ditch region in the middle section of the second poly-Si active layer below the second gate electrode by conducting P-type ion heavy doping to lateral end sections of the second poly-Si active layer not covered by the second gate electrode using the second gate electrode as shielding layer, and removes the photoresist protection layer.

The semi-transparent mask of step S1 has an opaque section, a semi-transparent section, and a remaining transparent section. The opaque section is for forming the first photoresist pattern and the first photoresist section of the second photoresist pattern. The semi-transparent section is for forming the second photoresist section of the second photoresist pattern.

The semi-transparent mask of step S1 is a gray tone mask (GTM) or a half tone mask (HTM).

The ashing process of step S4 is conducted using oxygen.

The second etching of step S5 is a dry etching with an etching gas comprising oxygen and chlorine.

The first etching of step S2 is a dry etching with an etching gas comprising one or more of sulphur hexafluoride (SF6), pentafluoroethane (C2HF5), and carbon tetrafluoride (CF4).

The N-type ion heavy doping of step S3 is by phosphorus (P) ions and doping density is $1\times10^{14}$-$1\times10^{15}$ ions/cm$^2$.

Specifically, the N-type ion light doping of step S6 is by phosphorus (P) ions and doping density is $1\times10^{12}$-$1\times10^{13}$ ions/cm$^2$.

The P-type ion heavy doping of step S7 is by boron (B) ions and doping density is $1\times10^{14}$-$1\times10^{15}$ ions/cm$^2$.

Step S1 further includes, before forming the buffer layer, forming a first shading block and a second shading block laterally spaced apart on the substrate, respectively below the first and second poly-Si active layers.

The advantages of the present invention are as follows. The CMOS LTPS TFT substrate manufacturing method, by a semi-transparent mask, forms a second photoresist pattern having a second photoresist section above a second poly-Si active layer where P-type ion heavy doping is to be performed as protection. Then, N-type ions are effectively prevented from being implanted into the second poly-Si active layer's second source/drain contact region when conducting N-type ion heaving doping to the first poly-Si active layer. Compared to the prior art, there is no need to additionally compensate P-type ions during the subsequent P-type ion heavy doping to the second poly-Si active layer for forming the second source/drain contact region. The present invention therefore reduces the productivity loss in the P-type ion heaving doping process and, as N-type ion heaving doping does not affect the PMOS transistors, enhances the electrical convergence of the PMOS transistors. In the meantime, as the number of times of ion implantation to the second poly-Si active layer is reduced, damage to the film lattice structure by the ion implantation is also reduced, thereby increasing the device reliability.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

Figure 1:
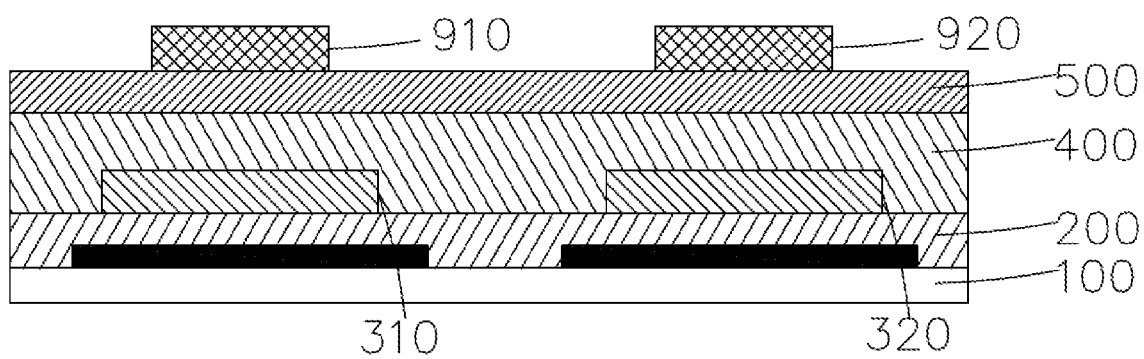
FIG. 1 shows the manufacturing of a CMOS LTPS TFT substrate after a step S10 of a conventional manufacturing method using re-etch LDD technique.
Figure 2:
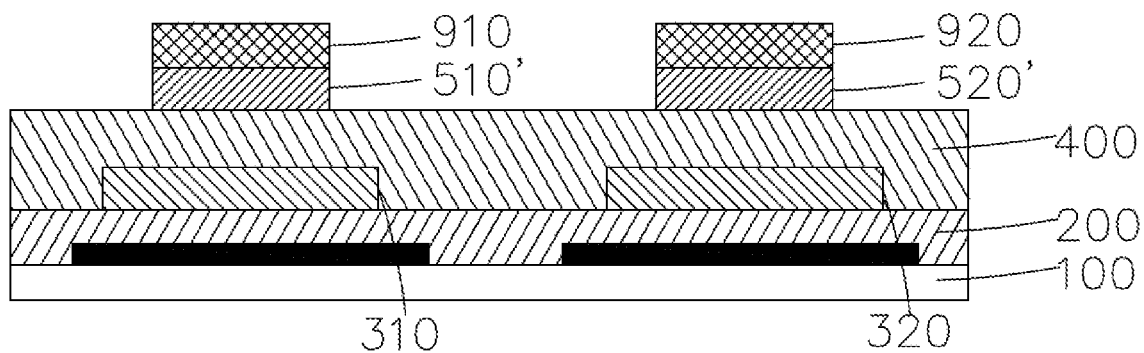
FIG. 2 shows the manufacturing of a CMOS LTPS TFT substrate after a step S20 of a conventional manufacturing method using re-etch LDD technique.
Figure 3:
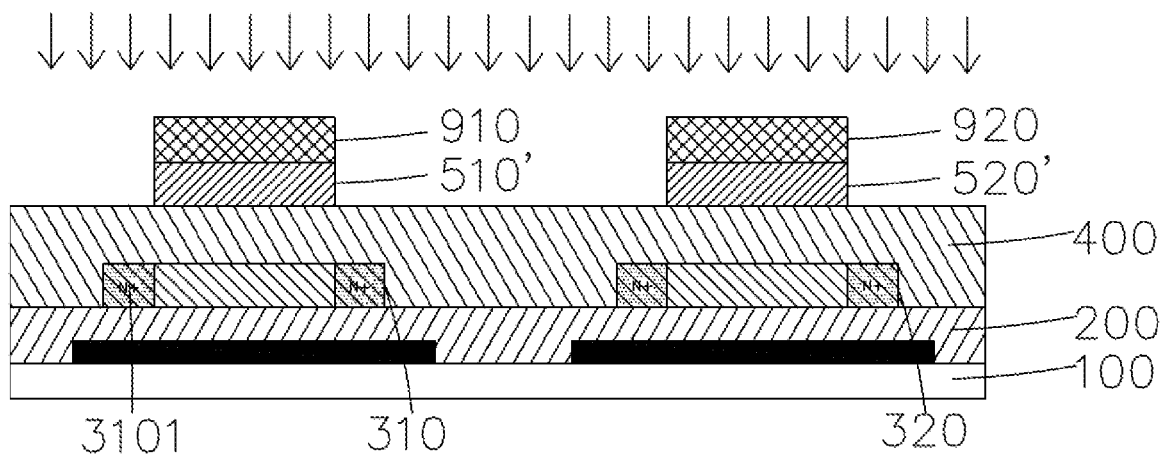
FIG. 3 shows the manufacturing of a CMOS LTPS TFT substrate after a step S30 of a conventional manufacturing method using re-etch LDD technique.
Figure 4:
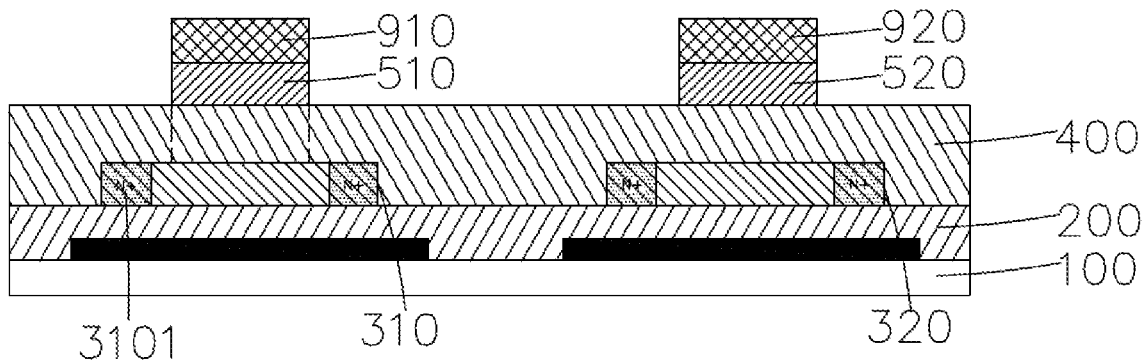
FIG. 4 shows the manufacturing of a CMOS LTPS TFT substrate after a step S40 of a conventional manufacturing method using re-etch LDD technique.
Figure 5:
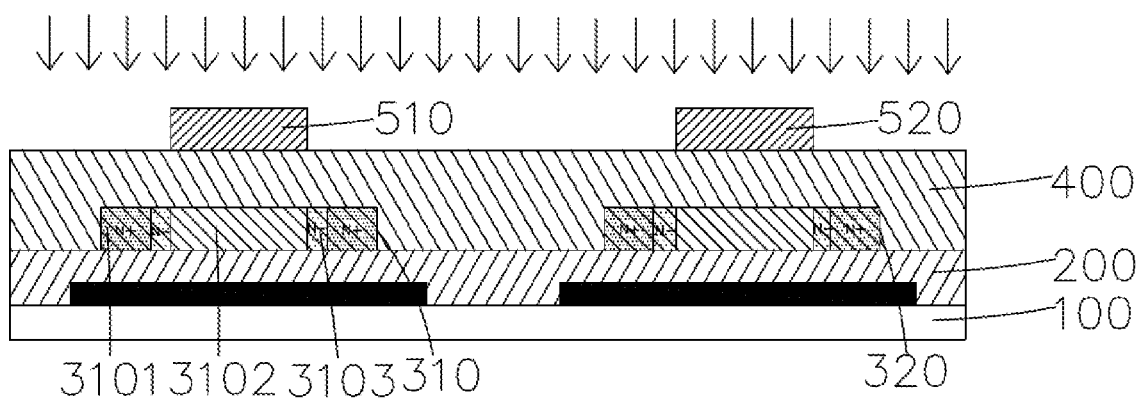
FIG. 5 shows the manufacturing of a CMOS LTPS TFT substrate after a step S50 of a conventional manufacturing method using re-etch LDD technique.
Figure 6:
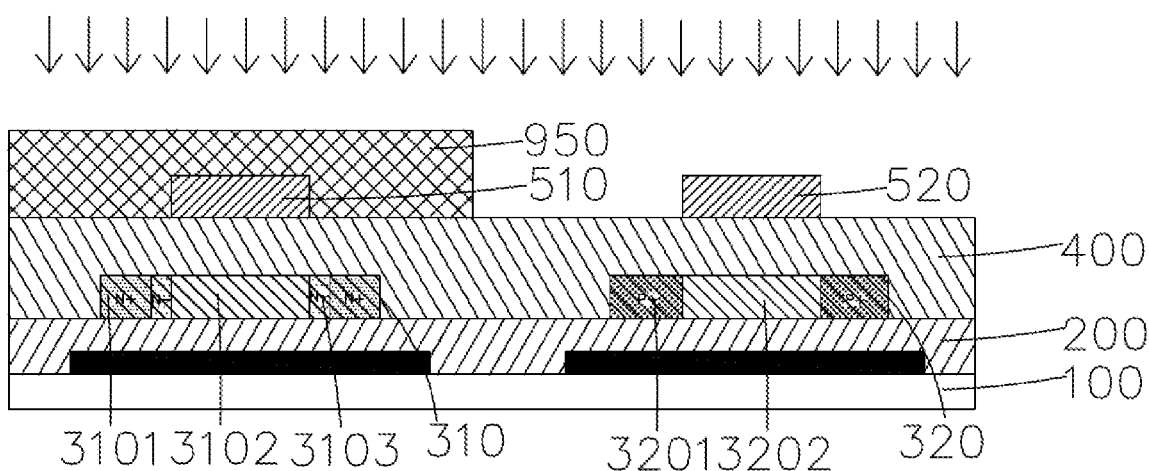
FIG. 6 shows the manufacturing of a CMOS LTPS TFT substrate after a step S60 of a conventional manufacturing method using re-etch LDD technique.
Figure 7:
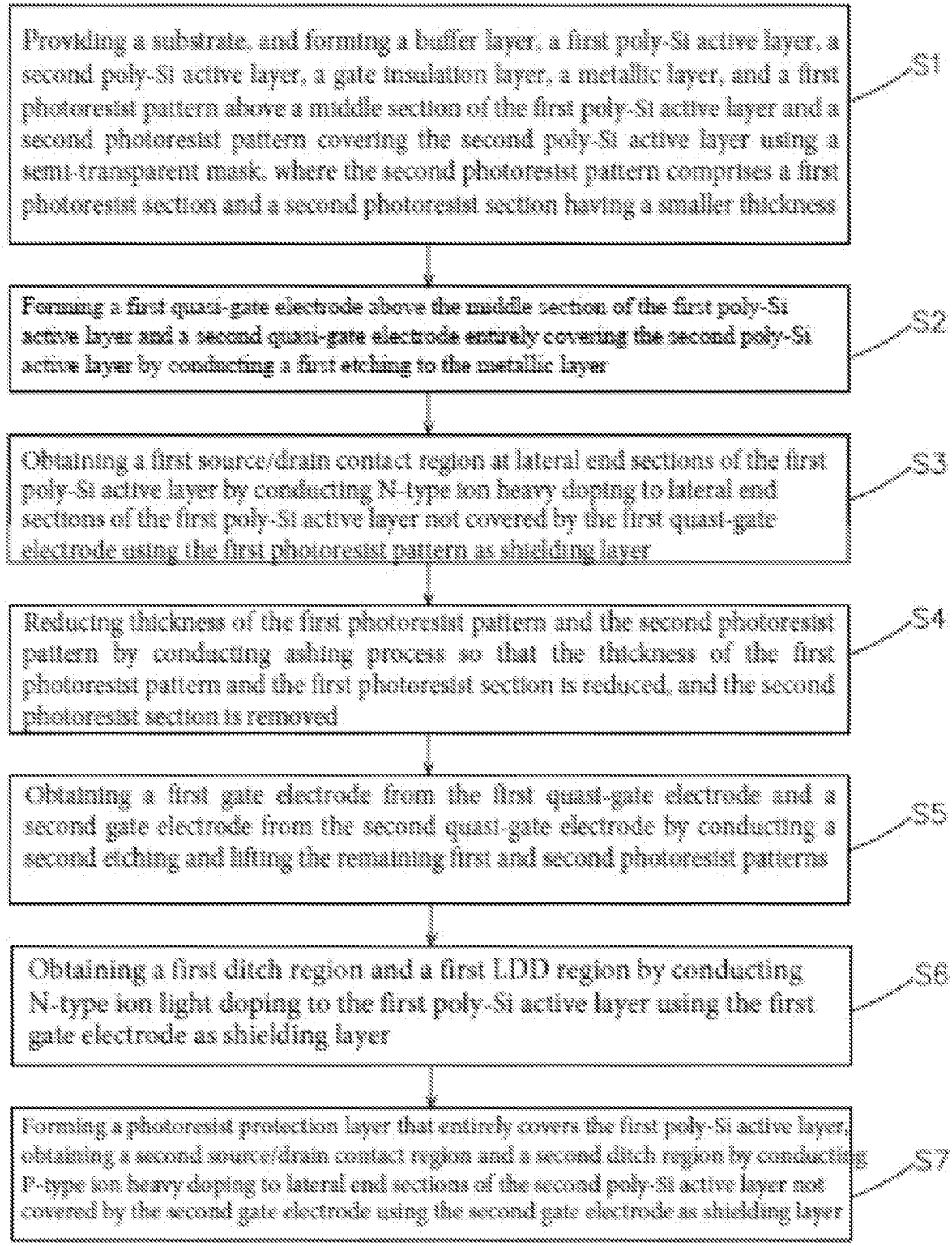
FIG. 7 is a flow diagram showing a manufacturing method for CMOS LTPS TFT substrate according to an embodiment of the present invention.

As shown in FIG. 7, a CMOS LTPS TFT substrate manufacturing method includes the following steps.

Figure 8:
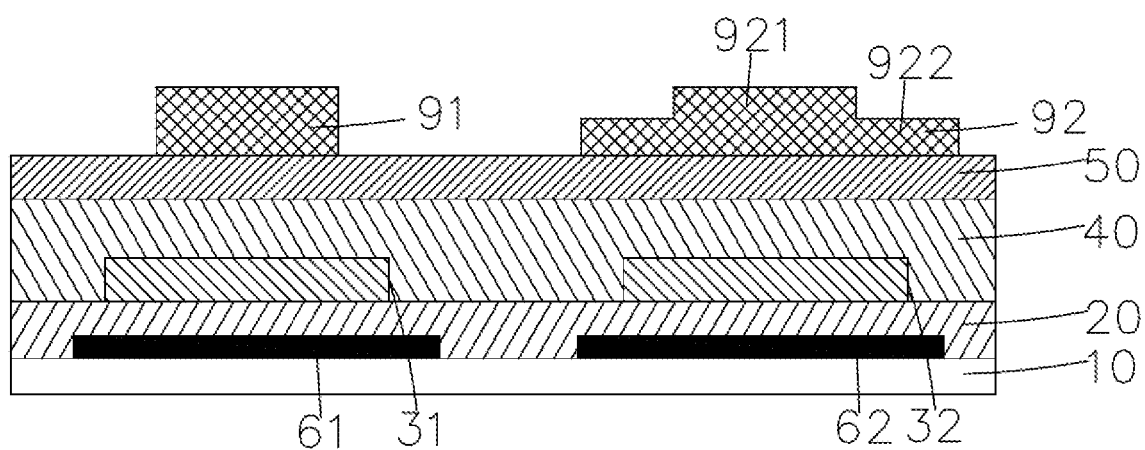
FIG. 8 shows the manufacturing of a CMOS LTPS TFT substrate after the step S1 of FIG. 7.

Step S1, as shown in FIG. 8, provides a substrate 10, and forms a first shading block 61 and a second shading block 62 laterally spaced apart on the substrate 10, a buffer layer 20 covering the first and second shading blocks 61 and 62, a first poly-silicon (poly-Si) active layer 31 corresponding NMOS and a second poly-Si active layer 32 corresponding PMOS on the buffer layer 20 respectively above the first and second shading blocks 61 and 62, a gate insulation layer 40 covering the first and second poly-Si active layers 31 and 32, a metallic layer 50 deposited on the gate insulation layer 40, and a first photoresist pattern 91 above a middle section of the first poly-Si active layer 31 and a second photoresist pattern 92 entirely covering the second poly-Si active layer 32 on the metallic layer 50 on the metallic layer 50 by coating photoresist on the metallic layer 50 and conducting exposure and development to the photoresist with a semi-transparent mask. The second photoresist pattern 92 includes a first photoresist section 921 in the middle and a second photoresist section 922 adjoining the lateral sides of the first photoresist section 921 and having a thickness smaller than the first photoresist section 921.

Specifically, the semi-transparent mask of step S1 has an opaque section, a semi-transparent section, and a remaining transparent section. The opaque section is for forming the first photoresist pattern 91 and the first photoresist section 921 of the second photoresist pattern 92. The semi-transparent section is for forming the second photoresist section 922 of the second photoresist pattern 92.

Specifically, the semi-transparent mask of step S1 is a gray tone mask (GTM) or a half tone mask (HTM).

Figure 9:
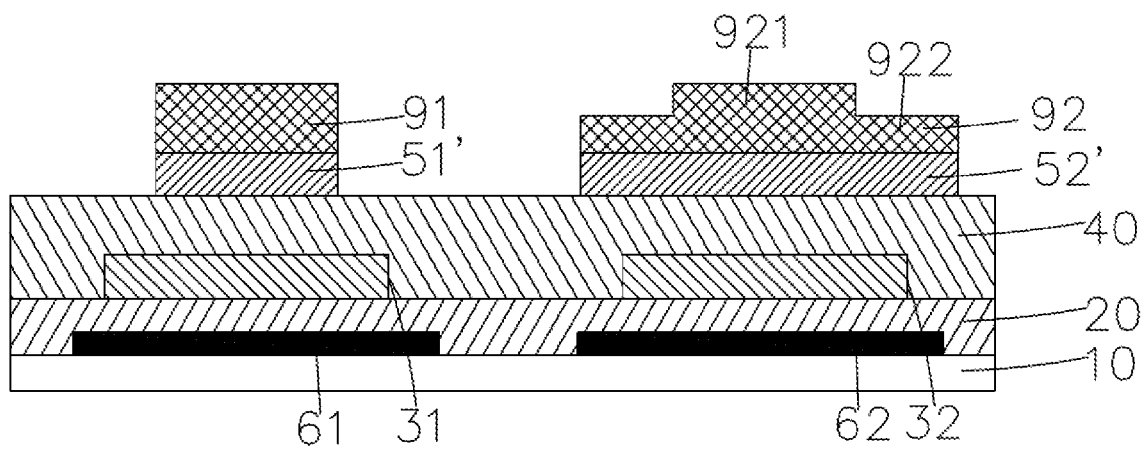
FIG. 9 shows the manufacturing of a CMOS LTPS TFT substrate after the step S2 of FIG. 7.

Step S2, as shown in FIG. 9, forms a first quasi-gate electrode 51' above the middle section of the first poly-Si active layer 31 and a second quasi-gate electrode 52' entirely covering the second poly-Si active layer 32 by conducting a first etching to the metallic layer 50 using the first and second photoresist patterns 91 and 92 as shielding layer.

Specifically, the first etching of step S2 is a dry etching, and the etching gas used includes sulphur hexafluoride (SF6), pentafluoroethane (C2HF5), and carbon tetrafluoride (CF4).

Figure 10:
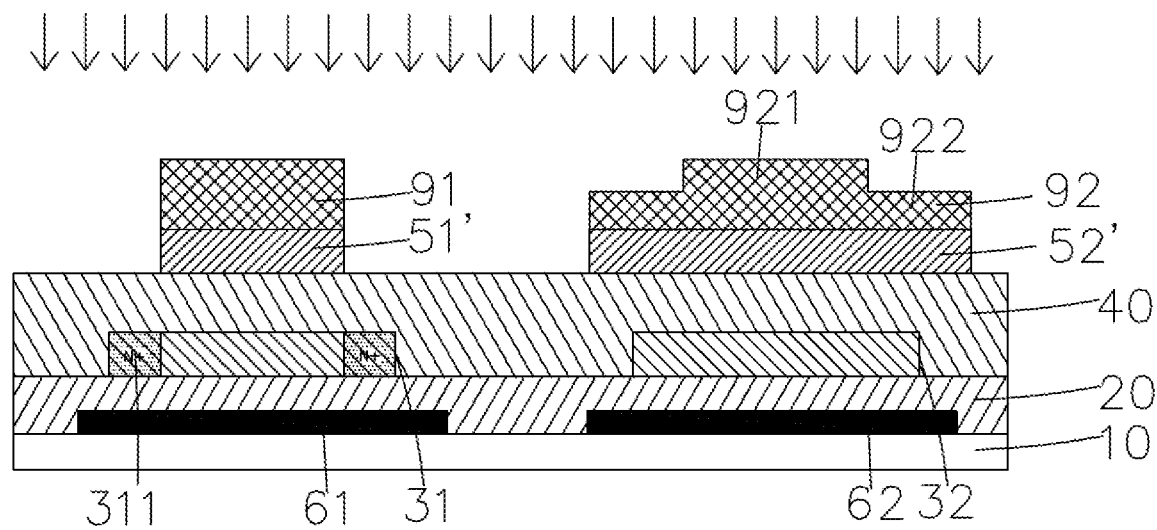
FIG. 10 shows the manufacturing of a CMOS LTPS TFT substrate after the step S3 of FIG. 7.

Step S3, as shown in FIG. 10, obtains a first source/drain contact region 311 at lateral end sections of the first poly-Si active layer 31 by conducting N-type ion heavy doping to lateral end sections of the first poly-Si active layer 31 not covered by the first quasi-gate electrode 51' using the first photoresist pattern 91 and the first quasi-gate electrode 51' as shielding layer.

Specifically, The N-type ion heavy doping of step S3 is by phosphorus (P) ions and doping density is $1\times10^{14}$-$1\times10^{15}$ ions/cm$^2$.

Figure 11:
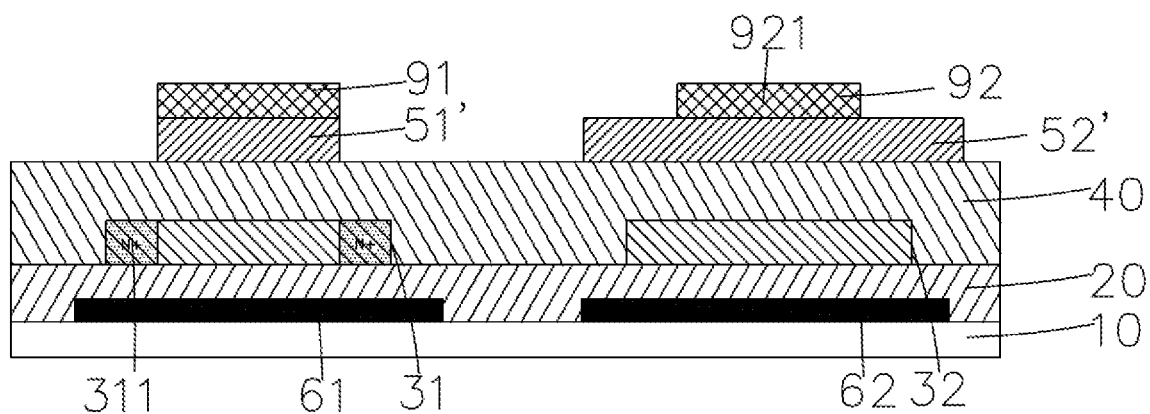
FIG. 11 shows the manufacturing of a CMOS LTPS TFT substrate after the step S4 of FIG. 7.

Step S4, as shown in FIG. 11, reduces the thickness of the first photoresist pattern 91 and the second photoresist pattern 92 by conducting ashing process to the first and second photoresist patterns 91 and 92, so that the thickness of the first photoresist pattern 91 and the first photoresist section 921 of the second photoresist pattern 92 is reduced, and the second photoresist section 922 of the second photoresist pattern 92 is removed to expose two lateral ends of the second poly-Si active layer 32.

Specifically, the ashing process of step S4 is conducted using oxygen.

Figure 12:
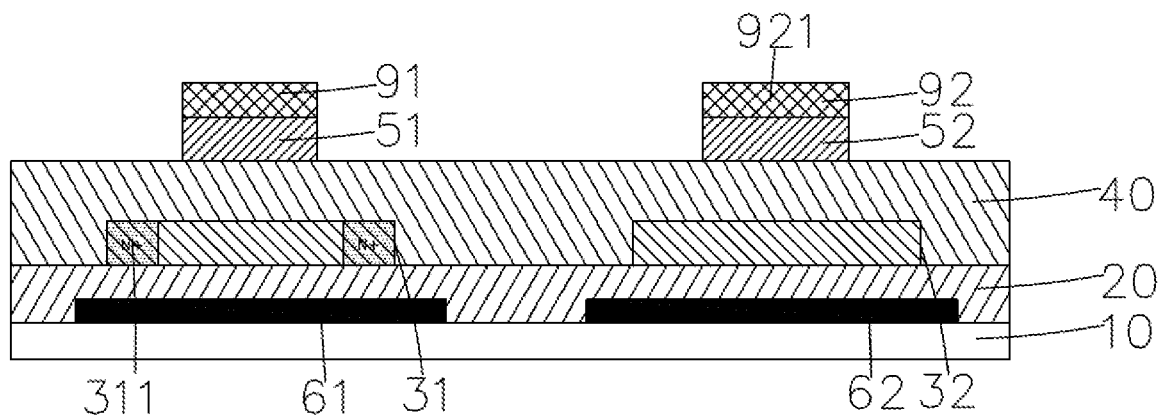
FIG. 12 shows the manufacturing of a CMOS LTPS TFT substrate after the step S5 of FIG. 7.

Step S5, as shown in FIG. 12, obtains a first gate electrode 51 from the first quasi-gate electrode 51' and a second gate electrode 52 from the second quasi-gate electrode 52' by conducting a second etching to the metallic layer 50 ad lifting the remaining first and second photoresist patterns 91 and 92, where the width of the second quasi-gate electrode 52' is reduced as its lateral ends are etched, and the second gate electrode 52 is above the middle section of the second poly-Si active layer 32.

Specifically, the second etching of step S5 is a dry etching, and the etching gas used includes oxygen and chlorine.

Figure 13:
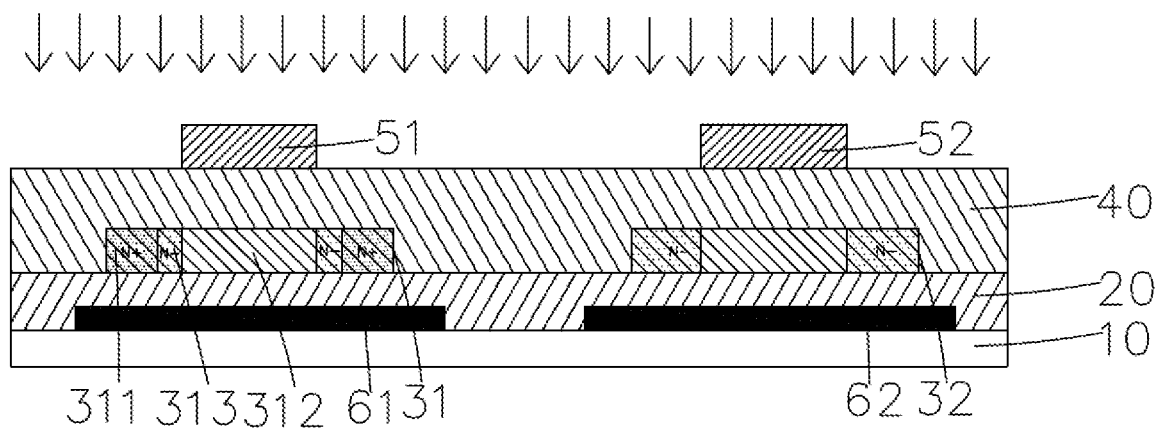
FIG. 13 shows the manufacturing of a CMOS LTPS TFT substrate after the step S6 of FIG. 7.

Step S6, as shown in FIG. 13, obtains a first ditch region 312 in the middle section of the first poly-Si active layer 31 below the first gate electrode 51, and a first lightly doped drain (LDD) region 313 between the first ditch region 312 and the first source/drain contact region 311 by conducting N-type ion light doping to lateral end sections of the first poly-Si active layer 31 not covered by the first gate electrode 51 using the first gate electrode 51 as shielding layer.

Specifically, the N-type ion light doping of step S6 is by phosphorus (P) ions and doping density is $1\times10^{12}$-$1\times10^{13}$ ions/cm$^2$.

Figure 14:
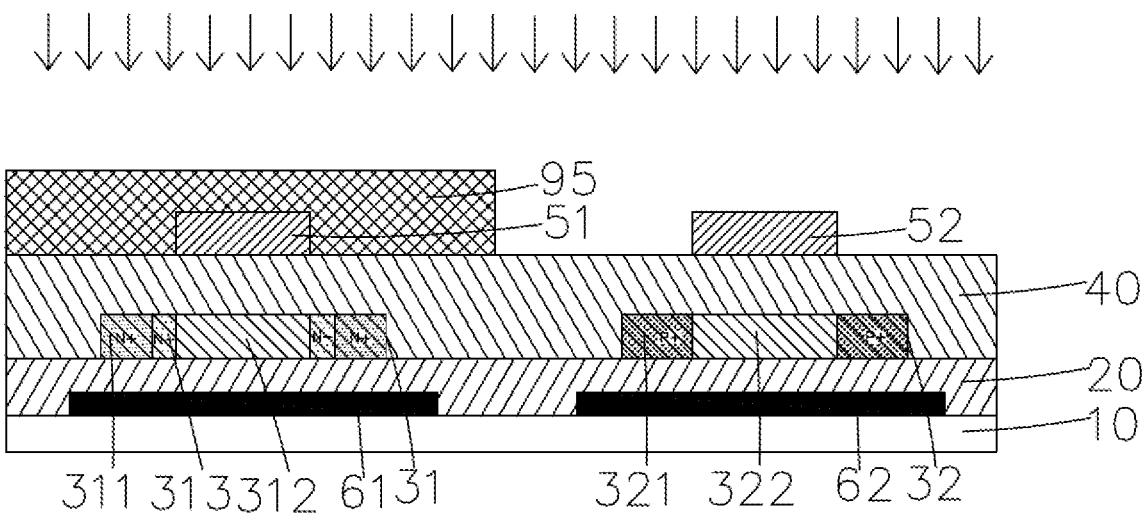
FIG. 14 shows the manufacturing of a CMOS LTPS TFT substrate after the step S7 of FIG. 7.

Step S7, as shown in FIG. 14, forms a photoresist protection layer 95 on the gate insulation layer 40 and the first gate electrode 51 that entirely covers the first poly-Si active layer 31, obtains a second source/drain contact region 321 at lateral end sections of the second poly-Si active layer 32 and a second ditch region 322 in the middle section of the second poly-Si active layer 32 below the second gate electrode 52 by conducting P-type ion heavy doping to lateral end sections of the second poly-Si active layer 32 not covered by the second gate electrode 52 using the second gate electrode 52 as shielding layer, and removes the photoresist protection layer 95. The photoresist protection layer 95 protects the first poly-Si active layer 31 from being implanted with P-type ions and affecting the NMOS when conducting the P-type ion heavy doping.

Specifically, the P-type ion heavy doping of step S7 is by boron (B) ions and doping density is $1\times10^{14}$-$1\times10^{15}$ ions/cm$^2$.

The CMOS LTPS TFT substrate manufacturing method, by the semi-transparent mask, forms the second photoresist pattern 92 having the second photoresist section 922 above the second poly-Si active layer 32 where P-type ion heavy doping is to be performed as protection. Then, N-type ions are effectively prevented from being implanted into the second poly-Si active layer 32's second source/drain contact region 321 when conducting N-type ion heaving doping to the first poly-Si active layer 31. Compared to the prior art, there is no need to additionally compensate P-type ions during the subsequent P-type ion heavy doping to the second poly-Si active layer 32 for forming the second source/drain contact region 321. The present invention therefore reduces the productivity loss in the P-type ion heaving doping process and, as N-type ion heaving doping does not affect the PMOS transistors, enhances the electrical convergence of the PMOS transistors. In the meantime, as the number of times of ion implantation to the second poly-Si active layer 32 is reduced, damage to the film lattice structure by the ion implantation is also reduced, thereby increasing the device reliability.

As described above, The CMOS LTPS TFT substrate manufacturing method, by a semi-transparent mask, forms a second photoresist pattern having a second photoresist section above a second poly-Si active layer where P-type ion heavy doping is to be performed as protection. Then, N-type ions are effectively prevented from being implanted into the second poly-Si active layer's second source/drain contact region when conducting N-type ion heaving doping to the first poly-Si active layer. Compared to the prior art, there is no need to additionally compensate P-type ions during the subsequent P-type ion heavy doping to the second poly-Si active layer for forming the second source/drain contact region. The present invention therefore reduces the productivity loss in the P-type ion heaving doping process and, as N-type ion heaving doping does not affect the PMOS transistors, enhances the electrical convergence of the PMOS transistors. In the meantime, as the number of times of ion implantation to the second poly-Si active layer is reduced, damage to the film lattice structure by the ion implantation is also reduced, thereby increasing the device reliability.

Above are embodiments of the present invention, which does not limit the scope of the present invention. Any equivalent amendments within the spirit and principles of the embodiment described above should be covered by the protected scope of the invention.

What is claimed is:

1. A manufacturing method for a complementary metal oxide semiconductor (CMOS) low temperature poly-silicon (LTPS) thin film transistor (TFT) substrate, comprising S1: providing a substrate, and forming a buffer layer on the substrate, a first poly-silicon (poly-Si) active layer and a second poly-Si active layer separated apart on the buffer layer, a gate insulation layer covering the first and second poly-Si active layers, a metallic layer deposited on the gate insulation layer, and a first photoresist pattern above a middle section of the first poly-Si active layer and a second photoresist pattern entirely covering the second poly-Si active layer on the metallic layer by coating photoresist on the metallic layer and conducting exposure and development to the photoresist with a semi-transparent mask, where the second photoresist pattern comprises a first photoresist section in the middle and a second photoresist section adjoining lateral sides of the first photoresist section and having a thickness smaller than the first photoresist section;

S2: forming a first quasi-gate electrode above the middle section of the first poly-Si active layer and a second quasi-gate electrode entirely covering the second poly-Si active layer by conducting a first etching to the metallic layer using the first and second photoresist patterns as shielding layer;

S3: obtaining a first source/drain contact region at lateral end sections of the first poly-Si active layer by conducting N-type ion heavy doping to lateral end sections of the first poly-Si active layer not covered by the first quasi-gate electrode using the first photoresist pattern as shielding layer;

S4: reducing thickness of the first photoresist pattern and the second photoresist pattern by conducting ashing process to the first and second photoresist patterns, so that the thickness of the first photoresist pattern and the first photoresist section of the second photoresist pattern is reduced, and the second photoresist section of the second photoresist pattern is removed to expose two lateral ends of the second poly-Si active layer;

S5: obtaining a first gate electrode from the first quasi-gate electrode and a second gate electrode from the second quasi-gate electrode by conducting a second etching to the metallic layer and lifting the remaining first and second photoresist patterns, where width of the second quasi-gate electrode is reduced as its lateral ends are etched, and the second gate electrode is above the middle section of the second poly-Si active layer;

S6: obtaining a first ditch region in the middle section of the first poly-Si active layer below the first gate electrode, and a first lightly doped drain (LDD) region between the first ditch region and the first source/drain contact region by conducting N-type ion light doping to the first poly-Si active layer using the first gate electrode as shielding layer; and S7: forming a photoresist protection layer on the gate insulation layer and the first gate electrode that entirely covers the first poly-Si active layer, obtaining a second source/drain contact region at lateral end sections of the second poly-Si active layer and a second ditch region in the middle section of the second poly-Si active layer below the second gate electrode by conducting P-type ion heavy doping to lateral end sections of the second poly-Si active layer not covered by the second gate electrode using the second gate electrode as shielding layer, and removing the photoresist protection layer.

2. The manufacturing method according to claim 1, wherein the semi-transparent mask of step S1 has an opaque section, a semi-transparent section, and a remaining transparent section; the opaque section is for forming the first photoresist pattern and the first photoresist section of the second photoresist pattern; and the semi-transparent section is for forming the second photoresist section of the second photoresist pattern.

3. The manufacturing method according to claim 1, wherein the semi-transparent mask of step S1 is a gray tone mask (GTM) or a half tone mask (HTM).

4. The manufacturing method according to claim 1, wherein the ashing process of step S4 is conducted using oxygen.

5. The manufacturing method according to claim 1, wherein the second etching of step S5 is a dry etching with an etching gas comprising oxygen and chlorine.

6. The manufacturing method according to claim 1, wherein the first etching of step S2 is a dry etching with an etching gas comprising one or more of sulphur hexafluoride (SF6), pentafluoroethane (C2HF5), and carbon tetrafluoride (CF4).

7. The manufacturing method according to claim 1, wherein the N-type ion heavy doping of step S3 is by phosphorus (P) ions and doping density is $1\times10^{14}$-$1\times10^{15}$ ions/cm$^2$.

8. The manufacturing method according to claim 1, wherein the N-type ion light doping of step S6 is by phosphorus (P) ions and doping density is $1\times10^{12}$-$1\times10^{13}$ ions/cm$^2$.

9. The manufacturing method according to claim 1, wherein the P-type ion heavy doping of step S7 is by boron (B) ions and doping density is $1\times10^{14}$-$1\times10^{15}$ ions/cm$^2$.

10. The manufacturing method according to claim 1, wherein step S1 further comprises, before forming the buffer layer, forming a first shading block and a second shading block laterally spaced apart on the substrate, respectively below the first and second poly-Si active layers.

* * * * *